United States Patent [19]

Letsch et al.

[11] Patent Number: 4,750,261
[45] Date of Patent: Jun. 14, 1988

[54] PICK UP HEAD

[75] Inventors: Karl H. Letsch, Wyomissing; George D. Reuss, Harrisburg; Leo V. Schuppert, Jr., York, all of Pa.

[73] Assignee: AMP Incorporated, Harrisburg, Pa.

[21] Appl. No.: 99,871

[22] Filed: Sep. 22, 1987

[51] Int. Cl.$^4$ .......................................... H05K 13/04
[52] U.S. Cl. ........................................ 29/739; 29/741; 29/759
[58] Field of Search ................ 29/739, 741, 743, 759; 907/40; 294/64.1; 414/737, 744 B

[56] References Cited

U.S. PATENT DOCUMENTS

| | | | |
|---|---|---|---|
| 4,533,075 | 8/1985 | Hallock et al. | 227/55 |
| 4,563,810 | 1/1986 | Adlon et al. | 29/749 |
| 4,611,846 | 9/1986 | Feiber et al. | 294/88 |
| 4,631,815 | 12/1986 | Bocchicchio et al. | 29/739 |
| 4,636,126 | 1/1987 | Spotts | 414/126 |
| 4,715,112 | 12/1987 | Jackson et al. | 29/739 |

*Primary Examiner*—Carl E. Hall
*Attorney, Agent, or Firm*—Thomas G. Terrell

[57] ABSTRACT

A robotic pick up head for use in picking up electrical connectors (25 and 27) having top actuated rivets (176) and being of different lengths, placing them on a circuit board (19) and setting the rivets (176) to secure the connectors (25 or 27) to the board (19), comprises a body (28) having a top plate (30) for connection to the Z axis shaft (18) of a pick and place robot (2). Opposed piston and cylinder drive units (70 and 72) in the body (28) drive a toggle linkage (50, 54) to drive plungers (142) of riveting tools (26), first to cause the tools (26) to grip the rivets (176) when a connector (25 or 27) is to be picked up and then to set the rivets (176) when they have been inserted into holes (H) in the board (19), to secure the connector thereto. The riveting tools (26) are carried by tool holders (90 96) one of which is slidable along a rail (88) on the body (28), by a further piston and cylinder drive unit (103), between two end positions to adjust the spacing between the riveting tools (26) for connector length.

12 Claims, 7 Drawing Sheets

PICK UP HEAD

This invention relates to a pick up head for use in picking up a workpiece having a pair of hollow rivets depending in spaced relationship from a lower surface thereof and opening into an upper surface thereof, and moving the workpiece towards the board to place said lower surface thereon, thereby to insert said rivets into said predetermined holes in the board.

The invention particularly, but not exclusively, concerns such a pick up head for use with a pick and place robot for picking up electrical connectors from a pick up station and placing them on a circuit board, according to a robotic program.

Some workpieces, and especially electrical connectors, to be placed on a circuit board, will be of different lengths, so that their rivets will be spaced from one another by different distances. It is therefore desirable that the pick up head should be adjustable to take account of these in accordance with the program of the pick and place robot. Although there is disclosed in patent application No. 944,058, filed on Dec. 10, 1986, a pick up head having riveting tools which are movable towards and away from one another manually, to adjust the tools for workpiece length, the tools are carried by individual arms which are pivoted to the pick up head for arcuate movement towards and away from one another. Also, plungers of the tools are arranged to be driven through working strokes to secure the tools to the rivets and to set the rivets, by means of a two stage piston and cylinder unit which is necessarily of considerable length and bulk and is mounted externally on the the pick up head.

According to the present invention, a pick up head for use in picking up a workpiece having a pair of hollow rivets depending in spaced relationship from a lower surface thereof and opening into an upper surface thereof and moving the workpiece towards a board to place said lower surface thereon thereby to insert said rivets into predetermined holes in the board, comprises a body having a vertical central axis and an upper face, means on said upper face for attaching said body to a longitudinally movable shaft, for example the Z axis shaft of a pick and place robot, with said central axis coincident with the axis of the shaft, first and second tool holders mounted to said body for relative movement towards and away from each other at right angles to said central vertical axis, a first drive unit on the body for bringing about said relative movement relatively to position said tool holders, a riveting tool depending from each tool holder in a direction parallel to said axis and having an actuating plunger, and oppositely acting second and third drive units on said body commonly coupled to both of said riveting tools for sequentially driving the plungers thereof each through a first portion of a working stroke to secure each tool to a rivet in which said tool has been inserted, a second portion of said working stroke to set said rivet so as to secure it in said predetermined hole in said board, and through a return stroke to release said tool from said rivet.

The first drive unit can readily be actuated in accordance with the program of a robot, for example, by the microprocessor of the robot, to adjust the spacing between the tool holders and thus the spacing between the tools, in accordance with workpiece length. Such adjustment is particularly easily and accurately effected if one of the tool holders is fixed to the body of the pick up head, the other tool holder being slidable therealong by means of the first drive unit between predetermined end positions. Stops may be provided to delimit two such end positions where two types of workpiece of different length are to be placed on the board in accordance with the robotic program.

The second and third drive units can be conveniently made of relatively small size, so that they do not project to any great extent from the pick up head and can mainly be accommodated in the body thereof. One of these drive units may be arranged to push a toggle linkage accommodated in the body, towards a straightened position, to drive the plungers through the first portions of their working strokes, the other of these drive units being arranged to pull the linkage into a fully straightened position to drive the plungers through the second portions of their working strokes.

Means may be provided for sensing when one or both of the rivets meets an obstruction, for example because the rivet is deformed and will not, therefore, enter its prescribed hole in the board, and for causing the robotic system to be shut down or the robot to raise the pick up head, the tools to be disengaged from the rivets and the faulty workpiece to be discarded.

When a pick up head, according to a preferred embodiment of the invention, is provided on a pick and place robot for picking up electrical connectors from a pick up station and placing them on a circuit board, the attachment means on said body is secured to the Z axis shaft of the robot and in operation, the shaft is lowered at the pick up station to insert the riveting tools into the rivets of an electrical connector at the station. The tools are then secured to the rivets by driving the plungers through the first portions of their working strokes and the Z axis shaft is raised by the robot with the connector secured to the pick up head. The robot transfers the pick up head to a position above a circuit board to which the connector is to be riveted, and then lowers the Z axis shaft to place the depending portion of each rivet in a predetermined hole in the circuit board, after which the plungers are driven through a second portion of their working strokes to set the rivets so that the connector is firmly fixed to the board, after which the plungers are driven through their return strokes and the robot is actuated to raise the pick up head, thereby withdrawing the tools from the rivets, leaving the connector secured to the board, the robot then returns the pick up head to the pick up station or to a pick up station for connectors of different length, to pick up a further connector in the manner described, and so on.

Means may be provided for assuring that when the plungers are driven through the second portions of their working strokes, the rivet setting force is applied only to the rivets, and not to the connector and thus to the board, whereby undue vibration of the board, which would disturb components previously mounted on the board for subsequent soldering thereto, is avoided. The provision of said means also avoids the rivet setting force being applied back to the Z axis shaft of the robot.

For a better understanding of the invention, reference will now be made by way of example to the accompanying drawings, in which:

FIGS. 7-9 are individual fragmentary sectional views illustrating successive stages in the operation of riveting tools of the pick up head;

Figure 1:
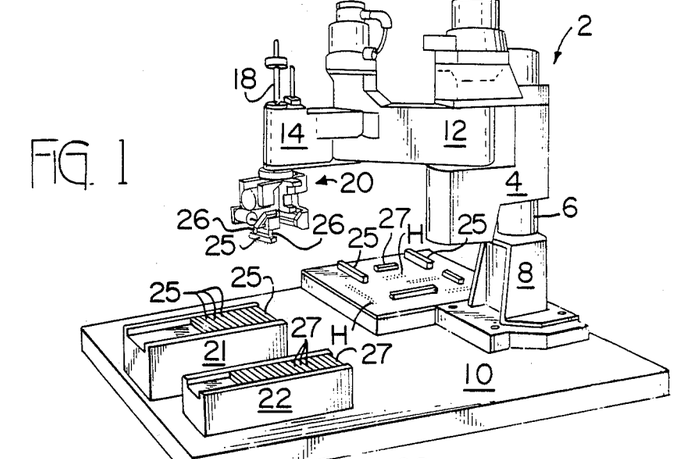
FIG. 1 is an isometric view of a pick and place robot operatively arranged in a work area in association with electrical connector pick up stations and an electrical connector assembly station, the robot having a pick up head for transferring electrical connectors from said stations to the assembly station.

As shown in FIG. 1, a pick and place robot 2 comprises a body 4 mounted for rotation about, and movement along, the axis of a vertical shaft 6 in a stand 8 secured to a work table 10. Mounted on the body 4 for rotation about a vertical axis is a first arm carrying on its end remote from the body 4, a second arm 14, which is rotatable with respect to the arm 12, also about a vertical axis. A vertical shaft 18 which is again rotatable about a vertical axis and which is extensible and retractable along such axis, depends from the arm 14 at its end remote from the arm 12. The axis of the shaft 18 is known as the Z axis of the robot. An electrical connector pick up head 20 fixedly mounted on the shaft 18 has riveting tools 26 depending therefrom in spaced relationship.

The body 4 is clamped prior to use of the robot 2, in a desired angular position and in a desired vertical position with respect to the shaft 6. The rotation of the arms 12 and 14 and the shaft 18, as well as the axial vertical movement of the shaft 18 are selectively controllable by means of a microprocessor (not shown) in accordance with a predetermined robotic program.

An electrical connector pick up head 20 is fixedly mounted on the shaft 18.

An assembly station 23 on the table 10 supports thereon a circuit board 19. Also on the work table 10 are first and second connector pick up stations 21 and 22 containing elongate electrical connectors 25 and 27, respectively, the connectors 25 being substantially longer than the connectors 27. The connectors 25 and 27, are to be mounted on the board 23 at accurately predetermined positions and in a predetermined order according to the program of the robot.

The robot 2 can be operated under the control of the microprocessor, to swing the head 20 over the pick up station 21, to lower the head 20 to engage the leading connector 25 at the station 21, to cause the riveting tools 26 depending upon the pick up head 20, to enter rivets (not shown in FIG. 1) at the ends of the leading connector 25 to cause the tools 26 releasably to be secured to the rivets, to raise the head 20, to swing it to a position over the board 19, to lower the head 20 to position the connector 25 on the board 19 to insert the rivets in holes H in the board 19, to cause the tools 26 to set the rivets to secure the connector 25 to the board 23, to raise the head 20 to withdraw the tools 26 from the rivets, and subsequently to cause the head 20 to pick up and place a further connector from the station 21 on the board 23, in the manner described above, or, as may be determined by the program, to then pick up the leading connector 27 from the pick up station 22 and place it on the board 23 in the manner described above with reference to the connector 25. The program ensures that the head 20 is rotated about the axis of the shaft 18 so that it is suitably oriented for each pick up and place operation. As will be described below, the spacing between the tools 26 is automatically adjusted, according to the robotic program, to accommodate either a connector 25 or a connector 27, as the case may be.

The head 20 and its operation will now be described with reference to FIGS. 2 to 14.

Figures 2, 6, 13:
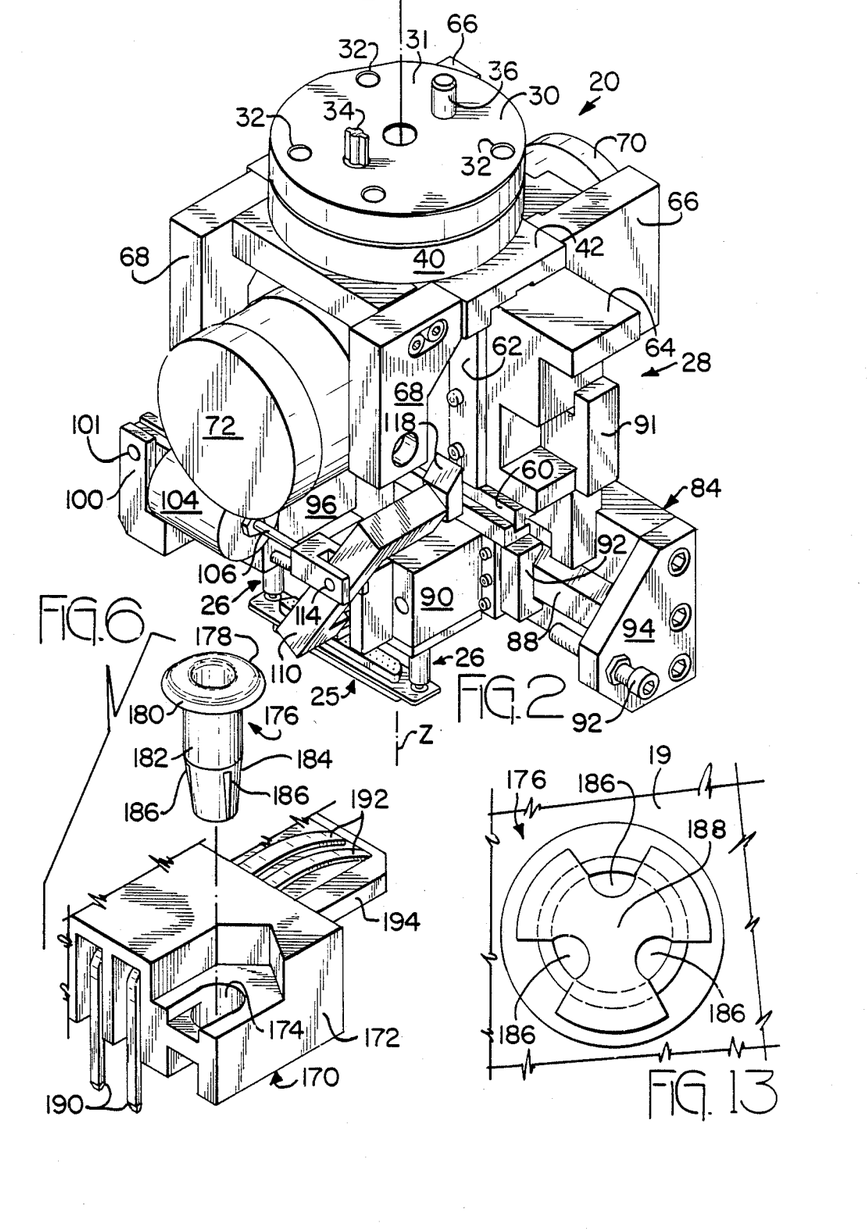
FIG. 2 is an isometric view of the pick up head of the robot.
FIG. 6 is a fragmentary isometric, partially exploded view showing one end of an electrical connector with a rivet exploded therefrom.
FIG. 13 is an underplan view showing a rivet which has been set by means of the riveting tools.
Figure 3:
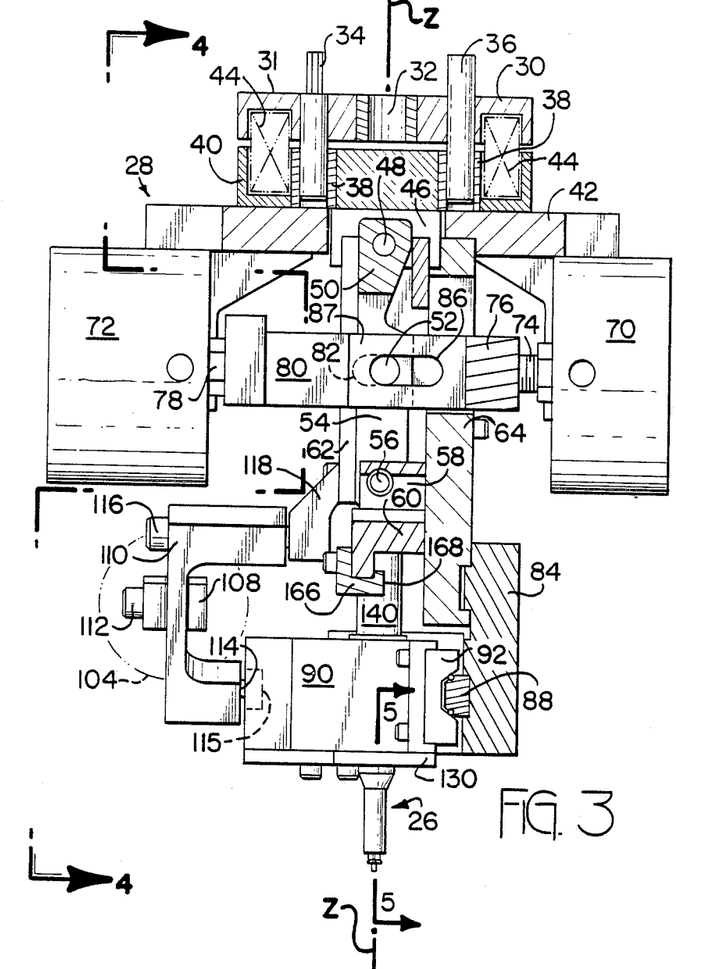
FIG. 3 is a view of the pick up head taken on the lines 3—3 of FIG. 4.
Figure 4:
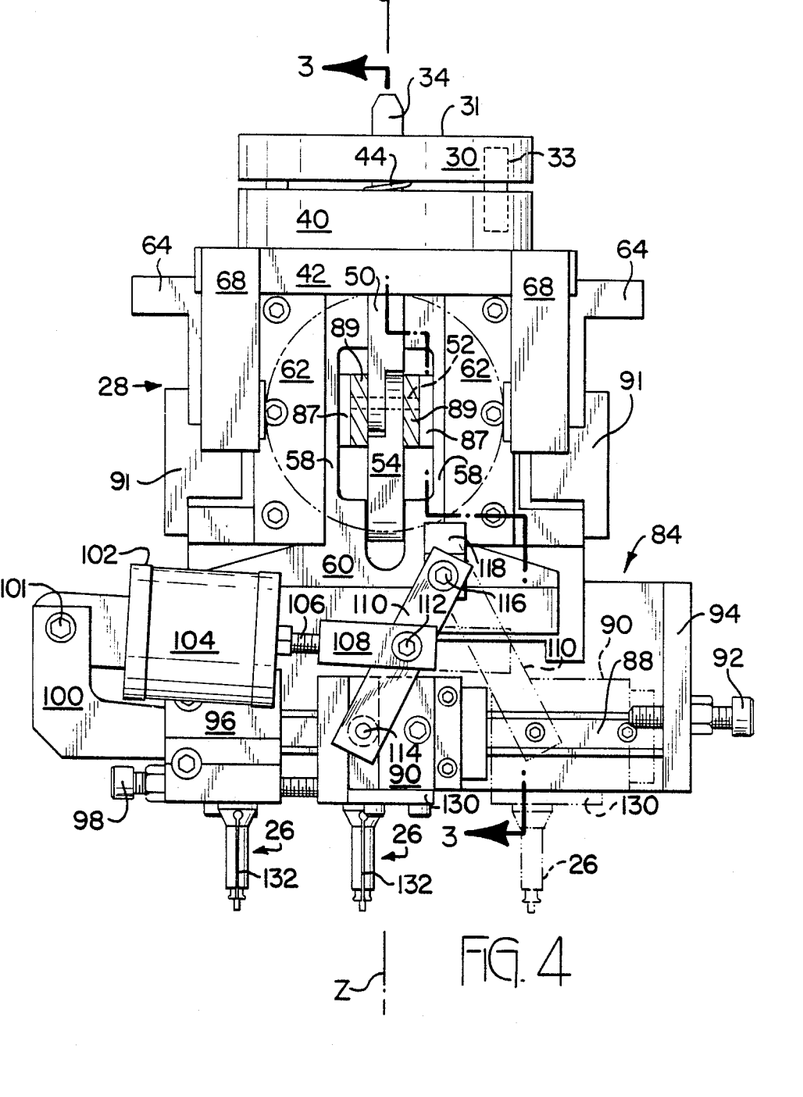
FIG. 4 is a view taken on the lines 4—4 of FIG. 3.

The pick up head 20 comprises, as best seen in FIGS. 2 to 4, a body which is generally referenced 28, having a central vertical axis Z, upon which axis is a mounting plate 30 having an upper face 31 in which are mounting holes 32 to receive fasteners (not shown) for securing the head 20 to the shaft 18 of the robot 2, by way of a conventional tool changer, so that the axis Z of the robot 2 coincides with the Z axis of the head 20. There project from the upper surface 31 of the plate 30, keying dowel pins 34 and 36 for keying the plate 31 to an adaptor plate on the shaft 18. The dowel pins 34 and 36 are fixed to the plate 30 and extend slidably through bushings 38 in a mounting block 40 secured to a top plate 42 of the body 28. The plate 30 is urged away from the block 40 by compression springs 44 but is movable there towards against the action of the springs 44. Sensor means 33 (FIG. 4) are arranged to sense the spacing between the plate 30 and the block 40.

Figure 12:
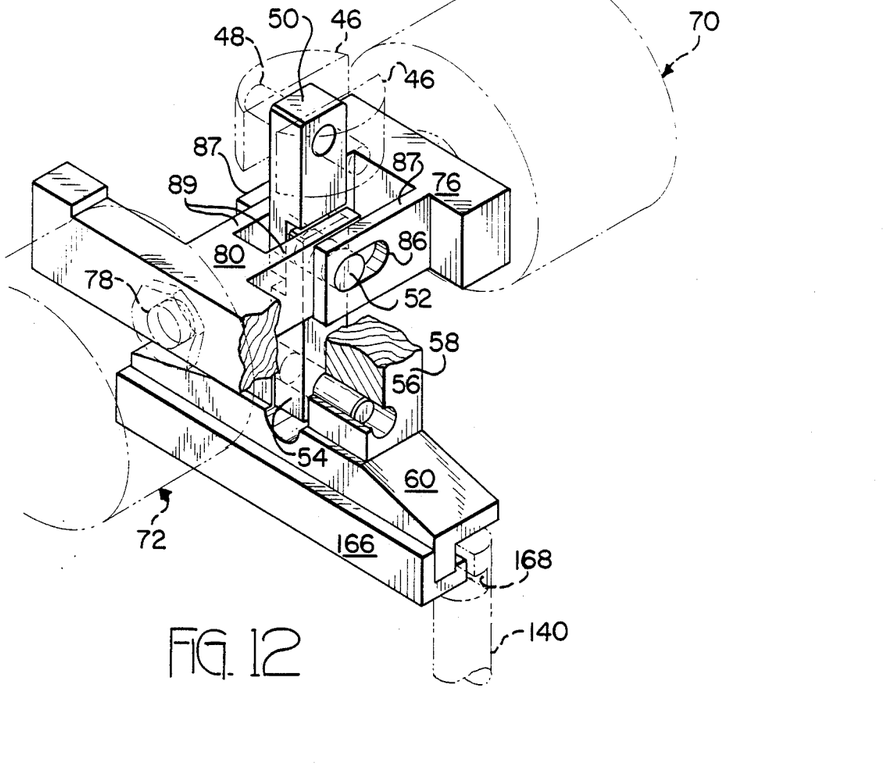
FIG. 12 is a fragmentary isometric view illustrating the details of the plunger driving mechanism.

Fixedly mounted in the plate 42 are spaced anchoring cheeks 46 (best seen in FIG. 12) in which is mounted, a horizontal first pivot pin 48 which passes through the upper end of a first toggle link 50 through the lower end of which passes a second pivot pin 52 which also passes through the upper end of a second toggle link 54, through the lower end of which passes a third pivot pin 56. The pin 56 is mounted in vertically extending, spaced extensions 58 of a slide 60, which is slidable in vertical gibs 62 secured to a transverse frame block 64 of the body 28. Pairs of support cheek plates 66 and 68 secured to the plate 42 and extending at right angles to the block 64, support opposed and oppositely acting, toggle link drive pneumatic piston and cylinder units 70 and 72, respectively. The unit 70 has a piston rod 74 fixed to a first clevis 76, the unit 72 having a piston rod 78 fixed to a second clevis 80, the arms 87 of the clevis 76 slidably receiving between them the arms 89 of the clevis 80, as best seen in FIG. 12. The ends of the pivot pin 52 are received in first, shorter slots 82 in the arms 89 of the clevis 80 and in second, longer slots 86 in the arms 87 of the clevis 76, the slots 82 and 86 extending longitudinally of the piston rods 74 and 78. A slideway bar 84 extending in the same direction as the block 64 is secured thereto by means of connecting plates 91 and is provided with a slideway in the form of a rail 88 extending longitudinally of the bar 84, a first tool holder 90 provided with a shoe 92 slidably engaging with the rail 88 is slidable therealong to an extent which is limited in the right hand (as seen in FIGS. 2 and 4) sense by an end position adjustment screw 92 threadedly received in an end cheek 94 secured to the bar 84. A second tool holder 96 is secured to the bar 84 at a position remote from the cheek 94, in the longitudinal direction of the bar 84 and has threaded there through an end position adjustment screw 98 for delimiting the end position of the tool holder 90 in the leftward (as seen in FIGS. 2 and 4) sense. At its opposite end to the cheek 94, the block 84 has a cranked arm 100 having a free end to which is pivotally attached by means of a pivot pin 101, the cylinder 102 of a pneumatic piston and cylinder, tool holder drive unit 104 having a piston rod 106 to which is fixed a celvis 108, the arms of which are pivotally attached to a substantially U-shaped tool holder drive lever 110, by a pin 114 extending through the center of the lever 110. The lower end of the lever 110 is pivotally connected to the tool holder 90 by means of a pivot pin 114, received in a slot 115 (FIG. 3) for vertical sliding movement there along. The upper end of the lever 110 is pivotally attached, by means of a pivot pin 116 to a bearing block 118 fixed to one of the gibs 62, as best seen in FIG. 3.

Figure 5:
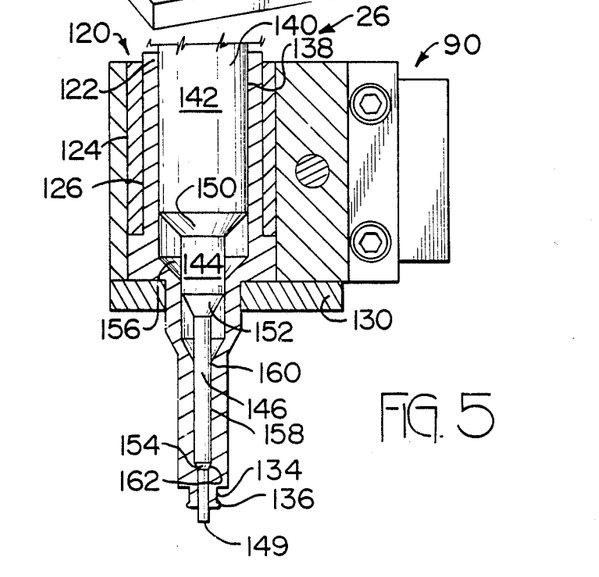
FIG. 5 is a view taken on the lines 5—5 of FIG. 3.
Figure 6:
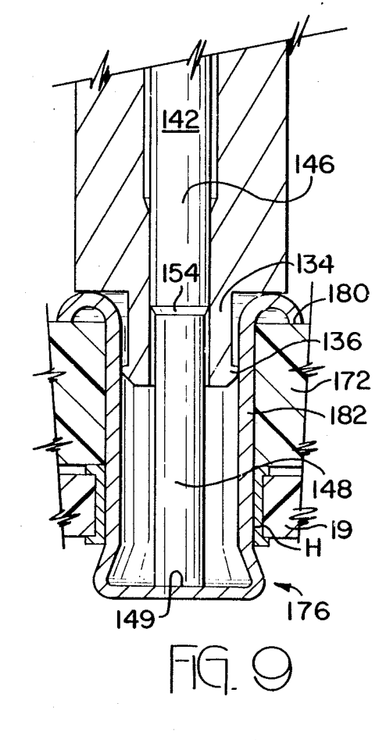

One of the riveting tools 26 is mounted in each tool holder 90 and 96, as best seen in FIG. 5, in respect of the tool holder 90. Each tool 26 comprises a one-piece collet 120 having an enlarged portion 122, which, as shown in FIG. 5, is received in a bushing 126 in a bore 124 in the tool holder. From the portion 122, a smaller cross section portion 128 of the collet 120 depends below a base plate 130 of the tool holder, the portion 128 being longitudinally divided into segments, by a plurality of longitudinal slots 132 (one of which is shown in FIG. 4), so that the portion 128 is radially and resiliently expansible. The portion 128 terminates in a reduced cross section nose 134 surrounded at its free end, by a barbed and projecting, expansible collar 136 which is axially divided by the slots 132. The bore of the collet 120 has, within the portion 122, a constant cross section part 138 receiving a shaft 140 of a circular cross section, one-piece, riveting plunger 142 having a first reduced cross section part 144 extending downwardly from the shaft 140, a second and more greatly reduced cross section part 146 extending downwardly from the part 144 and a third even more greatly reduced cross section part 148 extending downwardly from the part 146 and having a free end face 149 below the collar 136. The shaft 140 is connected by a chamfer 150 to the part 144, the part 146 being connected by a chamfer 152 to the part 146, and the part 148 being connected by a chamfer 154 to the part 148. The bore part 138 has a chamfered end part 156 for receiving the chamfer 150, the bore 158 in the collet portion 128 having an upper chamfered part 160 for receiving the chamfer 152 and a lower chamfered part 162 for receiving the chamfer 154. The shafts 140 of the plungers 142 are commonly connected to the slide 60 by means of an L-section bar 166, which is secured thereto and which engages in a transverse recess 168 in the upper end of each shaft 140, as best seen in FIGS. 3 and 12.

The drive units 70, 72 and 104 are actuable through pneumatic circuits (not shown) which are arranged to be controlled by the microprocessor of the robot 2.

Figure 7:
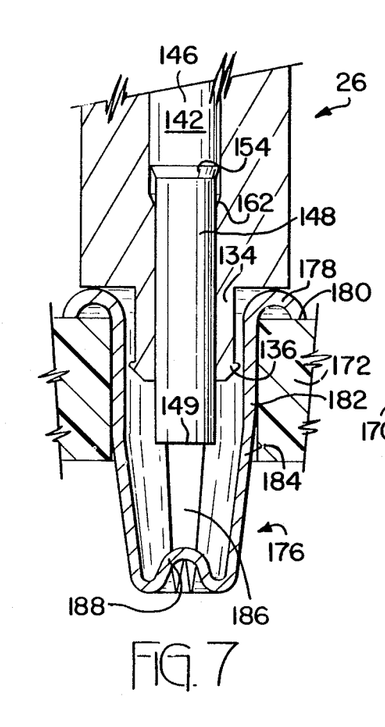
Figure 8:
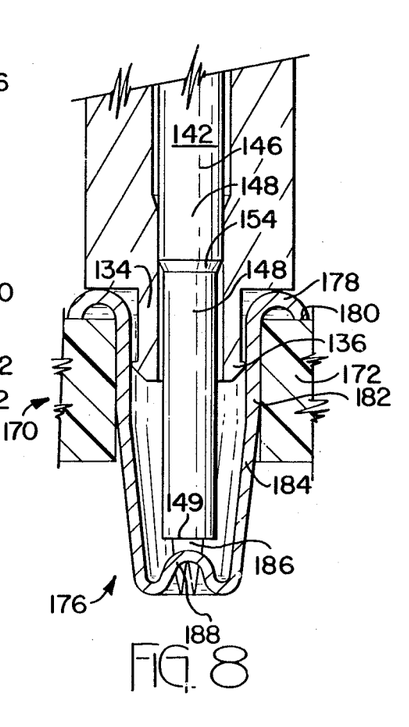

Each connector 25 and 27 comprises an insulating housing 170 having at each end thereof a mounting flange 172, one of which is shown in FIG. 6. Each flange 172 has an opening 174 therein receiving a hollow rivet 176 having a head 178 with an overturned edge 180 which engages the upper surface of the flange 172 as shown in FIGS. 7 to 9. There depends from the head 178, a hollow shaft 182 which is received in the opening 174 and terminates in a tapered portion 184 which depends below the bottom of the housing 170 and is formed with longitudinal slits 186 to assist the setting of the rivet 176, as described below.

As shown in FIGS. 7 and 8, the bottom 188 of the tapered portion 184 is bowed inwardly thereof to form a rounded dimple projecting into the interior of the rivet 176. There also depend from the housing 170, contact tails 190 which are connected to contacts 192 projecting laterally from the housing 170 on a contact platform 194 thereof.

Figure 10:
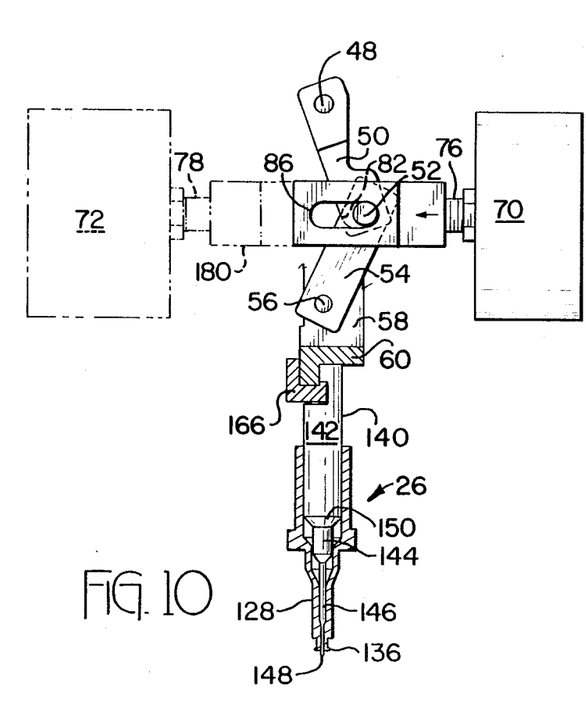
FIGS. 10 and 11 are diagrammatic views illustrating successive stages in the operation of a riveting tool, plunger driving mechanism of the pick up head.
Figure 11:
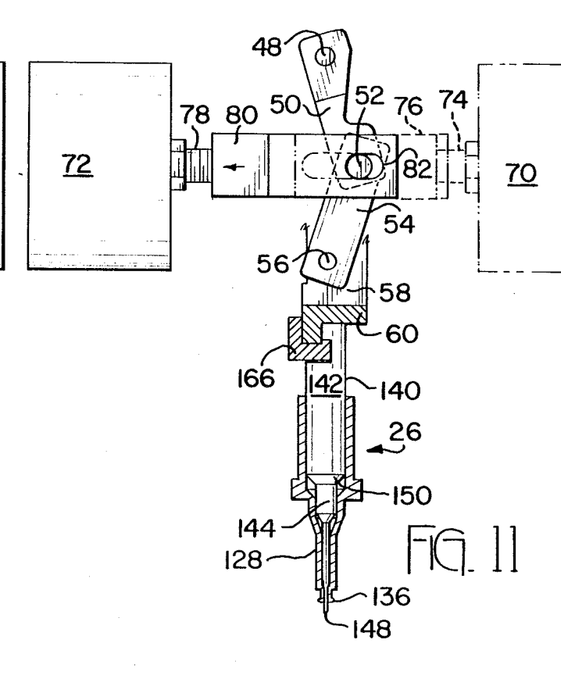

In order to pick up a connector from the station 21 or 22, the robot 2 lowers the head 20 towards the connector 25 or 27 to be picked up, so that each nose 134 of each tool 26 enters a respective rivet 176 as shown in FIG. 7, the spacing between the tools 26 having been previously angularly adjusted to connector length by actuating the drive unit 104 so that the tool holder 90 is moved to the appropriate end position along the rail 88, into engagement with the screw 92 or the screw 98, as the case may be, in accordance with the robotic program. For picking up a connector 25, the tool holder 90 is driven by the unit 104 against the screw 92, and for picking up a connector 27 the holder 90 is driven by the unit 104 into abutment with a screw 98. At this time, the piston rod 76 of the drive unit 70 is in its retracted position, the piston rod 78 of the drive unit 72 being in its advanced position, as shown in FIG. 10, whereby the pin 52 is positioned at the extreme right hand end of each slot 82 and 86 as shown in FIG. 10, so that the toggle linkage 50, 54 is in a broken position. In order to secure each tool 26 to its respective rivet 176, the unit 70 is actuated to advance its piston rod 76 to push the pin 52 against the right hand (as seen in FIG. 11) ends of the slots 82 whereby the toggle linkage 50, 54 is driven to a partially straightened position, as shown in FIG. 11. As the toggle linkage is being so straightened, the slide 60 is depressed, driving both of the plungers 142 of the tools 26 downwardly through a first portion of a working stroke, so that the chamfers 150, 152 and 154 of each plunger 142 engage with the respective chamfered parts 156, 160, and 162, of the bore parts 138 and 158, whereby the portion 128 of each collet 120 is expanded so that the barbed collar 136 thereof engages against and tightly grips the internal surface of the respective rivet 176 (FIG. 8), whereby each tool 26 is secured to the connector housing 170. The robot 2 is then actuated to raise the head 20 with the connector attached to the tools 96, as described above, to transfer the head 20 and thus the connector to a position above a desired location on the board 19, and to lower the head 20 so that the tapered end 184 of each rivet 176 is inserted into and extends below a respective hole in the board 19. The drive unit 72 is now actuated to retract its piston rod 78 so that, as shown in FIGS. 3 and 12, the pin 52 is pulled by the clevis 80 against the extreme left hand (as seen in FIGS. 3 and 12) end of the slots 86 whereby the toggle linkage 50, 54 is pulled to a fully straightened condition thereby further lowering the slide 60 to drive the free ends 149 of the plungers 142 against the bowed bottoms 188 of the rivets 176 to straighten them as shown in FIGS. 9 and 13 so that the portion 184 of the rivet is deformed radially outwardly to set the rivet and thus to secure the connector to the board 19. Since the barbed collar 136 of each nose 134 is firmly secured against the internal wall of the respective rivet 176, the force exerted by each plunger 142 against the respective rivet bottom 188 is taken up by the part of the rivet between the collar 136 and the bottom of the rivet, whereby such force is not transmitted to the board 19 so as to cause it to vibrate and thus to shake loose any components which may previously have been placed on the board 19 for subsequent soldering to the board 19, so as to displace them. Also, the rivet setting force is not transmitted back to the robot shaft 18 and thus to the arm 14.

Should the rivets 176 fail to enter the holes H in the board 19 (for example as a result of the rivets being damaged) as the head 20 is being lowered, so that they abut the board 19, the plate 30 will be driven down towards the body 28 against the action of the springs 44 thereby causing the sensor means 33 to signal to the microprocessor of the robot 2, to cause it to raise the head 20 and position it over a refuse bin (not shown), and the unit 70 to be then actuated to withdraw its piston rod 76 to its FIG. 10 position, whereby the slide 60 and the plungers 142 are raised so that the collet portions 128 radially retract under their own resilience, whereby the connector is released so as to fall into the bin.

When a connector has been successfully secured to the board 19 as described above, the unit 72 is actuated to advance its piston rod 78 to return the pin 52 to its FIG. 11 position, the unit 70 being then actuated to retract its piston rod 74 to return the pin 52 to its FIG. 10 position, whereby the tools 26 are released from the rivets 176 and the plungers 142 are returned to their starting positions. The robot is again actuated according to the program to pick up a further connector from the station 21 or 22 and to assemble it to the board 19, in the manner described above.

We claim:

1. A pick up head for use in picking up a workpiece having a pair of hollow rivets depending in spaced relationship from a lower surface thereof and opening into an upper surface thereof, and moving the workpiece towards a board to place said lower surface thereon thereby to insert said rivets into predetermined holes in the board, the pick up head comprising:

a body having a vertical central axis and an upper face;

means on said upper face for attaching said body to a longitudinally movable shaft with said central axis coincident with the axis of the shaft;

first and second tool holders mounted to said body for relative movement towards and away from each other at right angles to said central vertical axis;

a first drive unit on the body for bringing about said relative movement relatively to position said tool holders;

a riveting tool depending from each tool holder in a direction parallel to said central axis and having an actuating plunger; and oppositely acting second and third drive units on said body commonly coupled to both of said riveting tools for sequentially driving the plungers thereof each through a first portion of a working stroke to secure each tool to a rivet in which said tool has been inserted, a second portion of said working stroke to set said rivet so as to secure it in said predetermined hole in said board, and through a return stroke to release said tool from said rivet.

2. A pick up head as claimed in claim 1, wherein said second and third drive units are piston and cylinder units, having piston rods connected to a toggle linkage coupling said plungers to said drive units, said second drive unit being arranged to move said toggle linkage from a broken position towards a straightened position to drive each plunger through the first portion of its working stroke, and said third drive unit being arranged to drive each plunger through the second portion of its working stroke.

3. A pick up head as claimed in claim 2, wherein the piston rod of said second drive unit is coupled to a first clevis, the piston rod of said third drive unit being fixed to a second clevis receiving the first clevis, a central pivot pin of the toggle linkage extending through slots in both of said clevises, which slots extend axially of said piston rods, the slots in the first clevis being substantially shorter than the slots in the second clevis.

4. A pick up head as claimed in claim 3, wherein one link of the toggle linkage is pivotally attached to said body and to said pivot pin, the other link of the toggle linkage being pivotally attached to said pivot pin and to a slide which is mounted in the body for reciprocating movement in the direction of said central axis and which is connected to said plungers to drive them.

5. A pick up head as claimed in claim 4, wherein the first tool holder is movable along a slideway in said body by means of the first drive unit, the second tool holder being fixed to said body at one end of the slideway, stop means being provided to delimit end positions of the first tool holder lengthwise of the slideway.

6. A pick up head as claimed in claim 5, wherein the first drive unit is a piston and cylinder unit having a piston rod pivotally connected to a link one end of which is pivotally connected to the body and the other end of which is pivotally connected to the first tool holder, the cylinder of the first drive unit being pivotally connected to the body.

7. A pick up head as claimed in claim 1, wherein the first tool holder is slidable along a slideway on said body extending at right angles to said central axis, the second tool holder being fixed to said body at one end of said slideway, the first drive unit being coupled to the first tool holder for driving it along the slideway and stops being provided on said body and said second tool holder to delimit end positions of the first tool holder along the slideway.

8. A pick up head as claimed in claim 1, wherein said upper surface of the body is provided by a plate from which extend means for attaching the body to the longitudinally movable shaft, the plate being movable towards and away from the remainder of the body against the action of resilient means and sensor means being provided to detect movement of the plate towards the remainder of the body.

9. A pick up head as claimed in claim 8, wherein the plate is provided with vertical rods for keying to the vertical shaft, the rods being fixed to the platform and being slidably engaged in bushings in said remainder of the body.

10. A pick up head as claimed in claim 1, wherein each tool comprises a collet slidably receiving the plunger of the tool, the collet being longitudinally divided and terminating in an expansible, axially divided collar, the plunger having a camming portion for expanding the collet to cause the collar to grip the rivet.

11. A pick up head for use in picking up an electrical connector having a pair of hollow rivets depending in spaced relationship from a lower surface thereof and opening into an upper surface thereof and moving the connector towards a circuit board to place said lower surface thereon thereby to insert said rivets into predetermined holes in the board, the pick up head comprising:

a body having a vertical central axis and an upper face;

means on said upper face for attaching said body to a longitudinally movable shaft with said central axis coincident with the axis of the shaft;

a pair of tool holders mounted on said body, one of said tool holders being fixed to the body and the other being slidable along the body in a direction at right angles to said central axis;

a riveting tool depending from each tool holder in a direction parallel to said central axis, each tool having an actuating plunger;

a first drive unit attached to said body and being connected to said one tool holder to move it between predetermined positions lengthwise of said slideway;

a pair of oppositely positioned and oppositely acting piston and cylinder units mounted on said body above said tool holders and each having a piston rod;

a toggle linkage coupling said piston rods to said plungers, one of said drive units being arranged to push said toggle linkage from a broken position towards a straightened position to drive each plunger through a first portion of a working stroke to secure said tool to a rivet into which said tool has been inserted, and the other drive unit being arranged to pull said toggle linkage to its straightened position to drive said tools through a second portion of said working stroke to set said rivets and thereby to secure them in said predetermined holes in said circuit board.

12. A pick up head as claimed in claim 10, wherein each tool comprises a collet extending parallel to said central axis and depending from the tool holder, said collet slidably receiving the plunger of one of said riveting tools, said collet being longitudinally divided and terminating in an extensible collar, the tool having a camming portion for engaging a reduced diameter portion of the collet as the plunger is driven through the first portion of its working stroke, to expand said collar to grip the internal surface of a rivet into which said collet has been inserted.

* * * * *